(12) United States Patent
Ramakrishnan

(10) Patent No.: US 10,797,716 B1
(45) Date of Patent: Oct. 6, 2020

(54) IMAGING SYSTEMS HAVING SUCCESSIVE APPROXIMATION REGISTER (SAR) ANALOG-TO-DIGITAL CONVERTERS WITH REDUCED NON-LINEARITY

(71) Applicant: SEMICONDUCTOR COMPONENTS INDUSTRIES, LLC, Phoenix, AZ (US)

(72) Inventor: Shankar Ramakrishnan, Bangalore (IN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/667,428

(22) Filed: Oct. 29, 2019

Related U.S. Application Data

(60) Provisional application No. 62/897,629, filed on Sep. 9, 2019.

(51) Int. Cl.
| | | |
|---|---|---|
| *H03M 1/66* | (2006.01) | |
| *H03M 1/06* | (2006.01) | |
| *H03M 1/46* | (2006.01) | |
| *H03M 1/00* | (2006.01) | |
| *G09G 3/20* | (2006.01) | |
| *G09G 3/00* | (2006.01) | |
| *H01L 27/146* | (2006.01) | |

(52) U.S. Cl.
CPC ......... *H03M 1/0678* (2013.01); *H03M 1/468* (2013.01); *G09G 3/00* (2013.01); *G09G 3/2003* (2013.01); *H01L 27/14609* (2013.01); *H03M 1/00* (2013.01); *H03M 1/66* (2013.01)

(58) Field of Classification Search
CPC ..... H03M 1/66; H03M 1/00; H01L 27/14609; G09G 3/2003; G09G 3/00
USPC .......... 341/144, 145; 348/308; 345/690, 204
See application file for complete search history.

(56) References Cited

U.S. PATENT DOCUMENTS

| | | | |
|---|---|---|---|
| 9,307,172 | B2 | 4/2016 | Bock |
| 9,391,632 | B1 * | 7/2016 | Mikkelsen ............. H04N 5/378 |
| 9,450,596 | B2 | 9/2016 | Kim |
| 2012/0001781 | A1 | 1/2012 | Scanlan |
| 2016/0150173 | A1 | 5/2016 | Johansson |

\* cited by examiner

*Primary Examiner* — Joseph J Lauture
(74) *Attorney, Agent, or Firm* — Treyz Law Group, P.C.; Jason Tsai

(57) ABSTRACT

An image sensor may contain an array of imaging pixels arranged in rows and columns. Each column of imaging pixels may be coupled to an analog-to-digital converter for converting analog imaging signals from the pixels to digital signals. The analog-to-digital converter may be implemented as a split successive approximation register (SAR) analog-to-digital converter (ADC). The split SAR ADC may include a coarse section and a fine section. During a reset sampling phase, a reset level is sampled with a predetermined pedestal value is applied to the coarse and fine sections. During reset conversion, a reset code is obtained. During a signal sampling phase, a signal level is sampled using inverted bits of the reset code for only the fine section. During signal conversion, a signal code is obtained. Operated in this way, differential non-linearity of the ADC is minimized.

20 Claims, 8 Drawing Sheets

IMAGING SYSTEMS HAVING SUCCESSIVE APPROXIMATION REGISTER (SAR) ANALOG-TO-DIGITAL CONVERTERS WITH REDUCED NON-LINEARITY

CROSS-REFERENCE TO RELATED APPLICATIONS

This application claims the benefit of U.S. Provisional Patent Application No. 62/897,629, filed on Sep. 9, 2019, the entire contents of which is incorporated herein by reference.

BACKGROUND

This relates generally to analog-to-digital converters, and more specifically, to image sensors with successive approximation register (SAR) analog-to-digital converters.

Modern electronic devices such as cellular telephones, cameras, and computers often use digital image sensors. Image sensors (sometimes referred to as imagers) may be formed from a two-dimensional array of image sensing pixels. The array of image sensing pixels are typically arranged in pixel rows and columns. Each pixel includes a photosensitive layer that receives incident photons (light) and converts the photons into electrical charge. Column sensing circuitry is typically coupled to each pixel column for reading out image signals from the image pixels.

Image sensors often include analog-to-digital conversion circuitry for converting analog signals generated from the image pixels to digital signals. In one configuration, an image sensor is provided with successive approximation register (SAR) analog-to-digital converters (ADCs). A conventional SAR ADC typically includes a capacitive digital-to-analog converter (DAC) array that is split into a coarse section and a fine section so that the ratios of the capacitors are more manageable in terms of area and layout.

This split-SAR architecture, however, introduces differential non-linearity (DNL) errors at the coarse bit transitions since the gain ratio or scaling factor of the two sections may depend on the parasitic capacitance of the fine array. In practice, coarse bit transitions could still occur even at low light conditions between reset and signal conversion phases, which would lead to undesired visual artifacts. Even without a split array, the DNL may worsen towards the most significant bit (MSB) code transitions.

It is within this context that the embodiments herein arise.

DETAILED DESCRIPTION

Embodiments of the present invention relate to image sensors, and more particularly to analog-to-digital conversion within image sensors. It will be recognized by one skilled in the art, that the present exemplary embodiments may be practiced without some or all of these specific details. In other instances, well-known operations have not been described in detail in order not to unnecessarily obscure the present embodiments.

Figure 1:
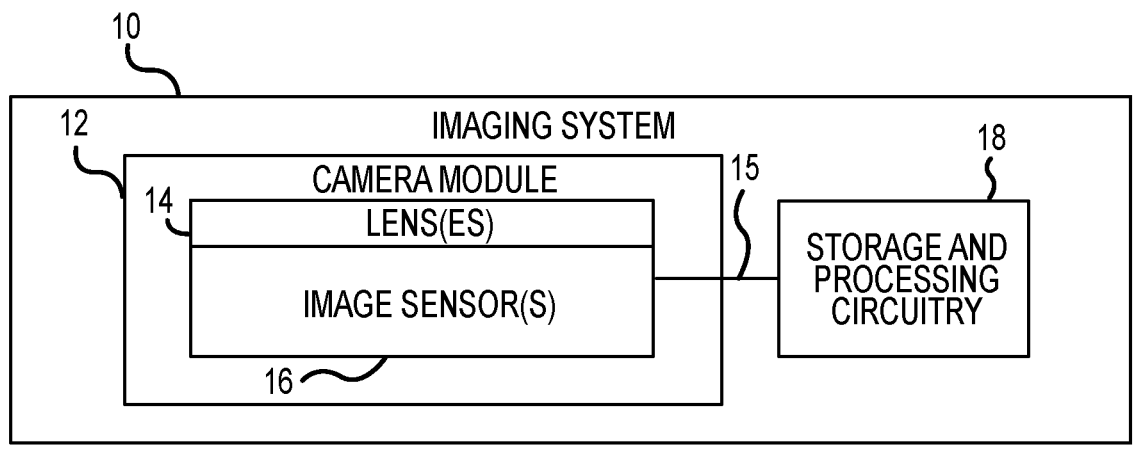
FIG. 1 is a diagram of an illustrative electronic device in accordance with an embodiment.

FIG. 1 is a diagram of an illustrative electronic device in accordance with an embodiment of the present invention. As shown in FIG. 1, imaging system 10 may be a portable imaging system such as a camera, automotive imaging system, cellular telephone, video camera, video surveillance system, or any other desired imaging device that captures digital image data. System 10 may include a camera module 12 that is used to convert incoming light into digital image data. Camera module 12 may include an array of lenses 14 and corresponding image sensor(s) 16. Lens(es) 14 and image sensor(s) 16 may be mounted in a common package and may provide image data to processing circuitry 18. Image sensors 16 may include one or more image sensors and lens array 14 may include one or more corresponding lenses.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensor array 16 or an integrated circuit within module 12 that is associated with image sensor array 16). Image data that has been captured and processed by camera module 12 may, if desired, be further processed and stored using processing circuitry 18. Processed image data may, if desired, be provided to external equipment (e.g., a computer or other device) using wired and/or wireless communications paths coupled to processing circuitry 18.

Each pixel in image sensor(s) 16 may receive light of a given color by providing each image pixel with a color filter. The color filters that are used for image sensor pixels in the image sensors may, for example, be red filters, blue filters, and green filters. Other filters such as white color filters, dual-band IR cutoff filters (e.g., filters that allow visible light and a range of infrared light emitted by LED lights), etc. may also be used.

Figure 2:
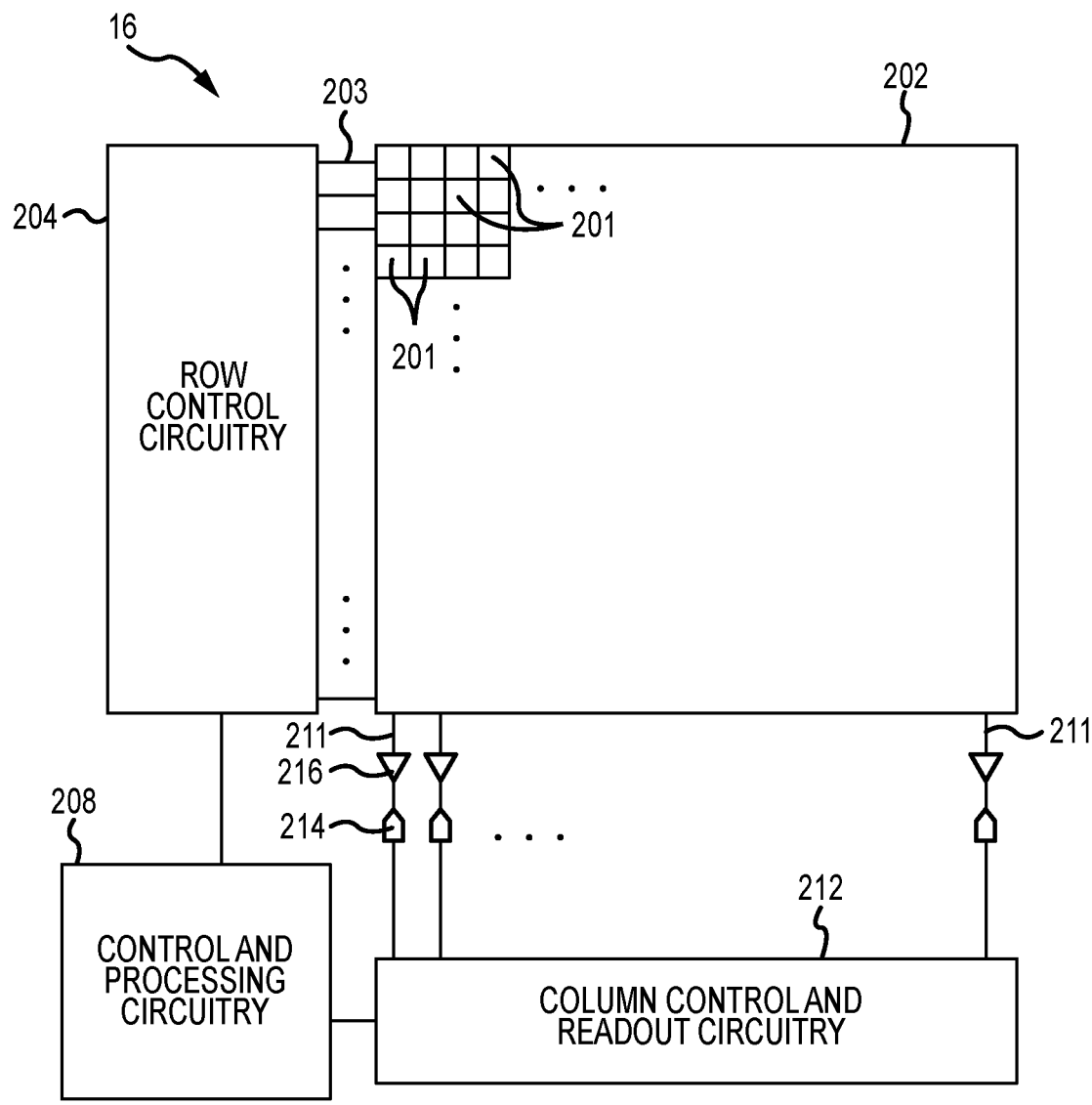
FIG. 2 is a diagram of an illustrative image pixel array in an image sensor in accordance with an embodiment.

FIG. 2 is a diagram of an illustrative image pixel array in an image sensor As shown in FIG. 2, the image sensor (e.g., image sensor 16 of FIG. 1) may include pixel array 202 having multiple pixels 201 (sometimes referred to herein as image pixels 201 or image sensor pixels 201) and row control circuitry 204 that is coupled to image pixel array 202. Row control circuitry 204 may provide pixel control signals (e.g., row select signals, pixel reset signals, charge transfer signals, etc.) to pixels 201 over corresponding row control lines 203 to control the capture and read out of images using image sensor pixels in array 202.

Image sensor 16 may include column control and readout circuitry 212 and control and processing circuitry 208 that is coupled to row control circuitry 204 and column circuitry 212. Column control circuitry 212 may be coupled to array 202 via multiple column lines 211. For example, each column of pixels 201 in array 202 may be coupled to a respective column line 211. A corresponding analog-to-digital converter (ADC) 214 and column amplifier 216 may be interposed on each column line 211 for amplifying analog signals captured by array 202 and converting the captured analog signals to corresponding digital pixel data. Column control and readout circuitry 212 may be coupled to external hardware such as processing circuitry. Column control and readout circuitry 212 may perform column readout based on signals received from control and processing circuitry 208. Column control and readout circuitry 212 may include column ADC circuits 214 and column amplifiers 216.

Amplifier 216 may be configured to receive analog signals (e.g., analog reset or image signals) from pixel array 202 and to amplify the analog signals. The analog signals may include data from a single column of pixels or from multiple columns of pixels, depending on the application. ADC 214 may receive amplified analog signals from amplifier 216 and may perform analog-to-digital conversion operations on the analog signals to generate digital data. The digital data may be transmitted to column control and readout circuitry 212 for processing and readout.

Figure 3A:
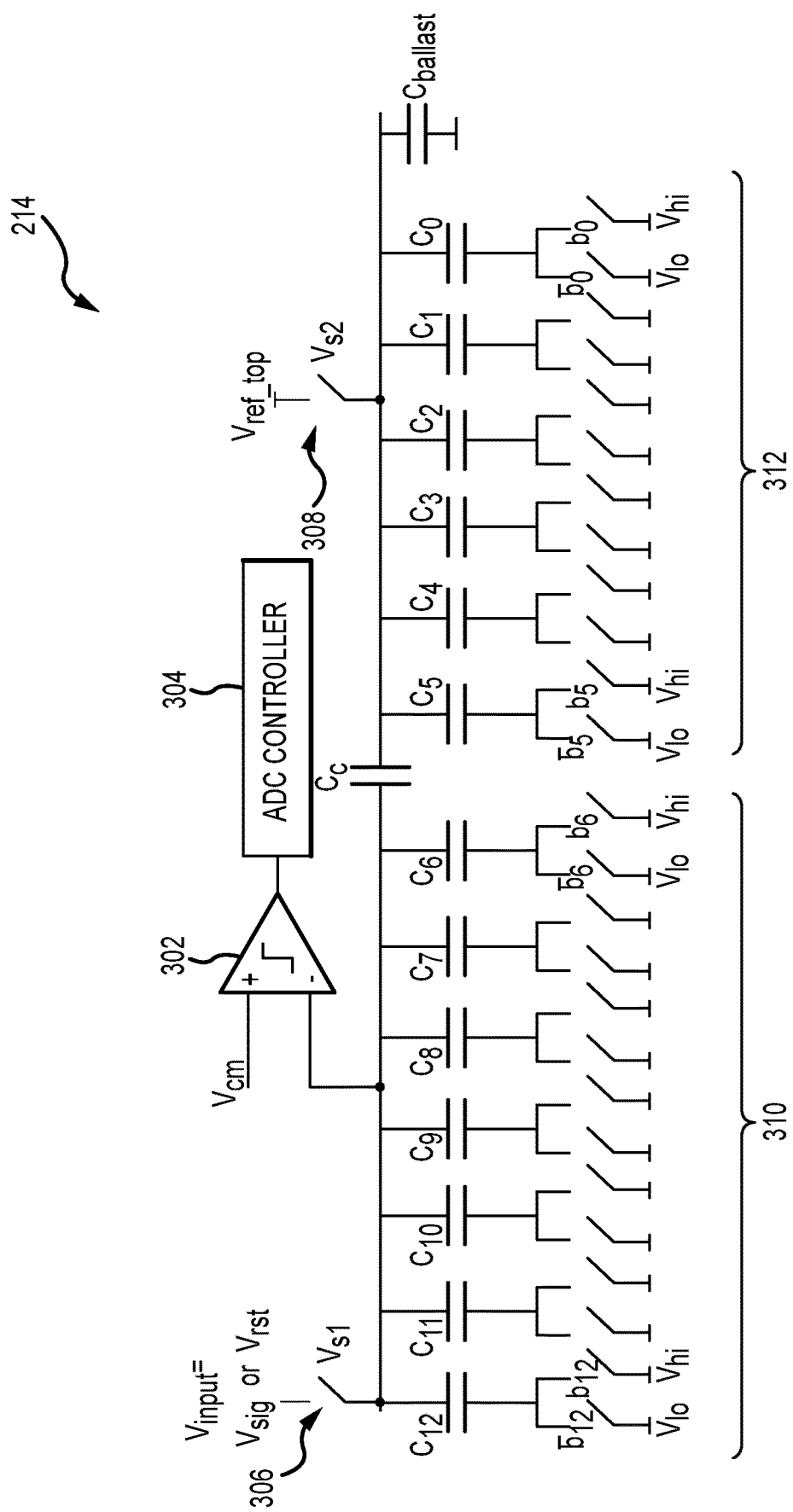
FIGS. 3A and 3B are circuit diagrams of illustrative analog-to-digital converters (ADCs) that may be included in an image sensor in accordance with some embodiments.

FIG. 3A is a circuit diagram of an illustrative analog-to-digital converter (ADC) circuit 214 that may be included in an image sensor. As shown in FIG. 3A, ADC 214 may include a comparator circuit 302, an ADC controller 304 configured to receive signals from the comparator 302, a first digital-to-analog converter (DAC) portion 310, and a second DAC portion 312. Comparator 302 may have a first (+) input that receives a common mode input voltage Vcm and a second (−) input that is coupled to the first DAC portion 310. The common mode voltage is a direct current (DC) voltage that may be set to equal to a reset level (as an example) so that ADC 214 outputs zero upon reset.

The first DAC portion 310 may include a first array of capacitors C6-C12, each of which is selectively coupled to either low voltage Vlo or high voltage Vhi via respective switches. For example, the bottom plate of capacitor C12 may be coupled to Vhi by asserting control bit b12 to turn on a corresponding Vhi switch or may be coupled to Vlo by deasserting control bit b12 to turn on a corresponding Vlo switch. Similarly, the bottom plate of capacitor C6 may be coupled to Vhi by asserting control bit b6 to turn on a corresponding Vhi switch or may be coupled to Vlo by deasserting control bit b6 to turn on a corresponding Vlo switch. Voltages Vlo and Vhi may generally be independent of common mode voltage Vcm. The top plate of capacitors C6-C12 may be coupled to the second (−) terminal of comparator 302. First portion 310 may sometimes be referred to as a most significant bit (MSB) DAC or a "coarse" DAC section.

An input voltage Vin may be selectively applied to the top plate of the MSB capacitors via input switch 306. Input switch 306 may be activated by asserting input control signal Vs1. The input voltage Vin may be equal to Vsig when reading out an image signal from a selected image sensor pixel or may be equal to a reset voltage Vrst when reading out a reset level from the selected image pixel.

The second DAC portion 312 may include a second array of capacitors C0-C5, each of which is selectively coupled to either low voltage Vlo or high voltage Vhi via respective switches. For example, the bottom plate of capacitor C5 may be coupled to Vhi by asserting control bit b5 to turn on a corresponding Vhi switch or may be coupled to Vlo by deasserting control bit b5 to turn on a corresponding Vlo switch. Similarly, the bottom plate of capacitor C0 may be coupled to Vhi by asserting control bit b0 to turn on a corresponding Vhi switch or may be coupled to Vlo by deasserting control bit b0 to turn on a corresponding Vlo switch. The top plate of capacitors C6-C12 may be coupled to the coarse section via coupling capacitor Cc. The use of coupling capacitor Cc can help allow the sizing ratio of capacitors between the two portions to be more manageable in terms of area and layout. Second portion 312 may sometimes be referred to as a least significant bit (LSB) DAC or a "fine" DAC section. As the names suggest, the MSB DAC section exhibits a coarser resolution, whereas the LSB DAC section exhibits a finer resolution.

A reference voltage Vref_top may be selectively applied to the top plate of the LSB capacitors via a reference switch 308. Reference switch 308 may be activated by asserting reference control signal Vs2. The top plate of the LSB capacitors may also be coupled to a ballast capacitor Cballast, which may include the parasitic capacitance of nearby interconnect routing. ADC 214 configured in this way is sometimes referred to as a "split SAR" ADC circuit. The ADC 214 of FIG. 3A in which the coarse section includes seven bits of resolution and in which the fine section includes six bits of resolution is merely illustrative and is not intended to limit the scope of the present embodiments. If desired, ADC 214 may have a split architecture where the MSB and LSB DACs can exhibit any suitable resolution.

Figure 4:
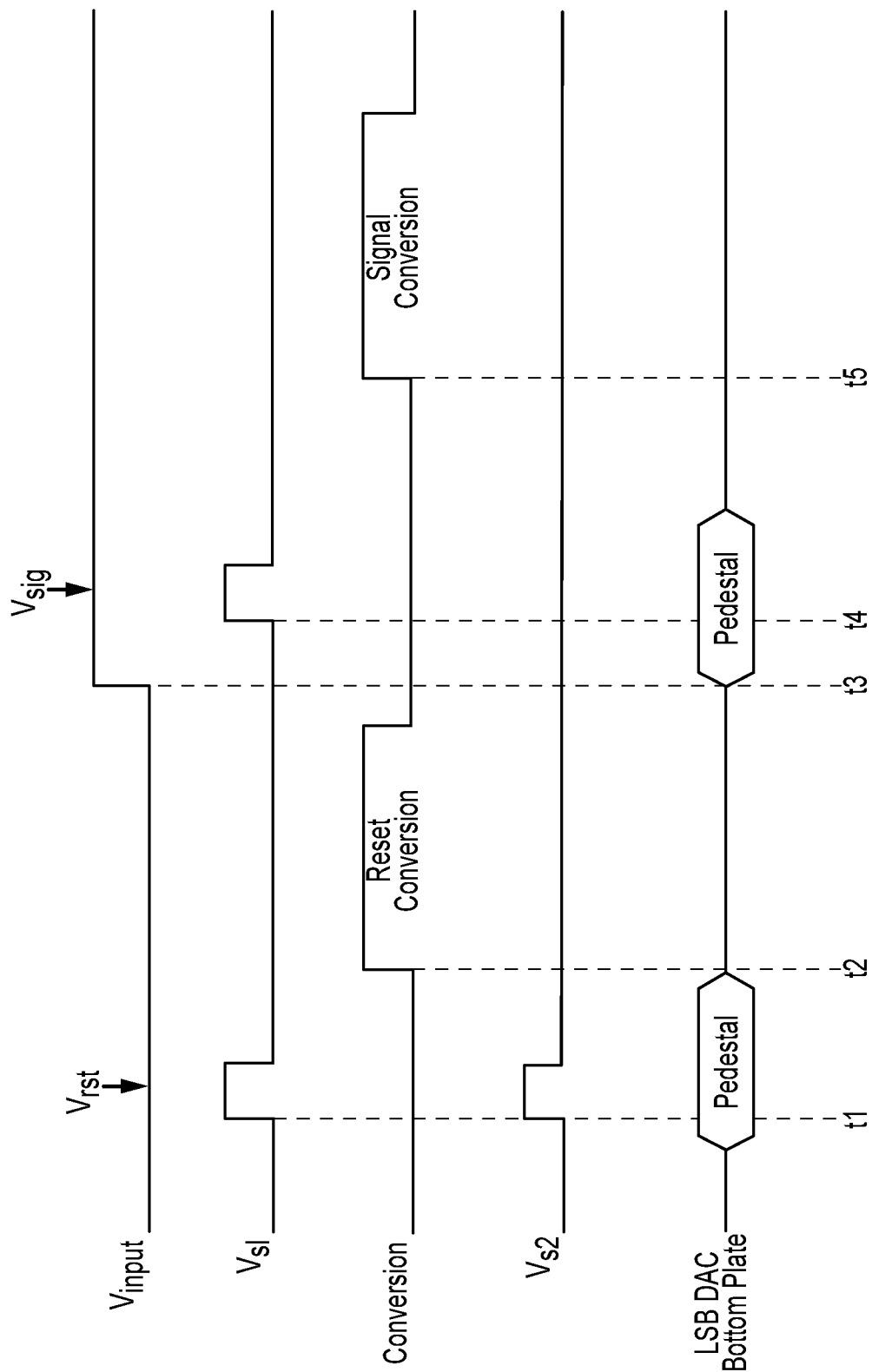
FIG. 4 is a timing diagram illustrating one way of operating the ADC shown in FIG. 3A.

FIG. 4 is a timing diagram illustrating one way of operating ADC 214 of the type shown in FIG. 3A. At time t1, control signals Vs1 and Vs2 are pulsed high while the input voltage Vinput is at a reset level Vrst and while the bottom plate of the LSB DAC is set at a pedestal level. The pedestal level is a programmable preset value that is generally used to correct an inherent offset potentially associated with comparator 302. The pedestal value may be loaded into the LSB DAC by applying reference voltage Vref_top to the top plate of the fine section while selectively asserting a predetermined pattern of control bits b0-b5. Even the MSB DAC can have a non-zero pedestal value, but this will remain unchanged from reset to signal conversions.

At time t2, a reset conversion operation may be performed to read out a reset voltage level from a selected image pixel (i.e., ADC 214 may output a digital code indicative of the reset voltage level Vrst received at time t1).

At time t3, the selected image pixel may output an image signal, which changes the ADC input voltage Vinput to a Vsig level. At time t4, control signal Vs1 is pulsed high to pass Vsig through to the MSB top plate and while the bottom plate of the LSB DAC is set to the predetermined pedestal level. The pedestal level that is provided to the LSB DAC bottom plate may be the same at times t1 and t4.

At time t5, a signal conversion operation may be performed to read out an image signal level from the selected image pixel (i.e., ADC 214 may output a digital code indicative of the signal voltage level Vsig received at time t4).

An ADC operated using the steps of FIG. 4 may introduce differential non-linearity (DNL) errors at the transition between the fine LSB bits and the coarse MSB bits since the gain ratio of the two sections depends on the parasitic capacitance (see Cballast) of the fine DAC array, which results in inherent matching challenges between the fine LSB DAC and coarse MSB DAC in the split SAR array.

DNL could lead to undesired visual artifacts in an image sensor, especially under dark or very low light conditions.

Referring still to FIG. 4, during sampling of Vrst and Vref_top at time t1, the switches of the capacitive DAC are configured to the pedestal value, which is an offset value typically used to improve the input operating voltage range of the ADC. The pedestal value is typically a fraction of the full scale value of the ADC and usually has non-zero bits in the coarse section. For example, in a 7-MSB/6-LSB split DAC array such as that of the split SAR ADC shown in FIG. 3A, if the pedestal value is ⅓₂ of the full scale value, the coarse value of the reset conversion will be non-zero. Even when the signal is very close to the reset value (i.e., even under very low light conditions), there is a high probability that some coarse bits of the signal conversion will be different from those of the reset conversion due to dark current and other noise sources.

Figure 5:
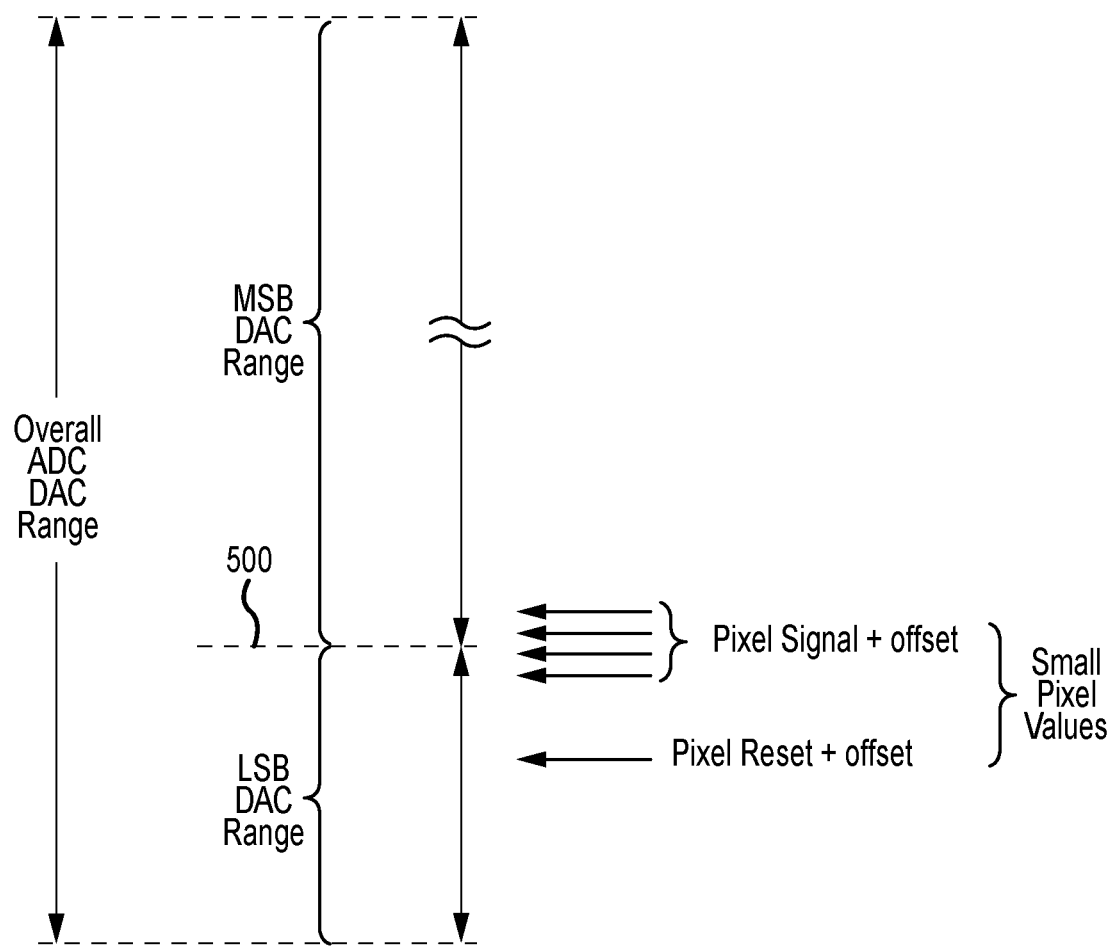
FIG. 5 is a diagram illustrating how small pixel signals can cross into the coarse digital-to-analog (DAC) range resulting in differential non-linearity (DNL) errors, wherein the LSB DAC range is repeated throughout the overall ADC DAC range.

For instance, consider a scenario in which the reset value is "0010101111110" while the signal value is "0010110000001." Even though the reset value and signal value only differ by three LSBs, that change is propagated to the 8th bit, which crosses into the coarse MSB section. This occurrence is illustrated in FIG. 5 where the pixel signal with the added pedestal offset can likely cross the MSB and LSB DAC split 500. As described above, this cross could potentially introduce severe noise in the subtracted value for a correlated double sampling (CDS) operation due to the DNL associated with the coarse bit transitions. This noise is exacerbated under low noise conditions where the noise is a large fraction of the difference between the signal and reset values.

In accordance with an embodiment, a method of operating the split SAR ADC is provided that solves this problem by ensuring that the coarse MSB bits do not change between the reset and signal values for all net (signal minus reset) values up to approximately the full scale value of the fine section. This may be accomplished by dynamically setting the offset value to a level where the LSB DAC range is maximized when converting small pixel signal values to avoid flipping the coarse bits in the MSB DAC. In one suitable arrangement, this programmable offset value may be set equal to an inverted version of the reset ADC value (instead of the pedestal value) during the pixel signal conversion phase. Additional margin may also be provided to account for random noise. Doing so will ensure that the DNL due to coarse bit transitions is prevented for low light conditions where image quality is most susceptible to noise.

Figure 6:
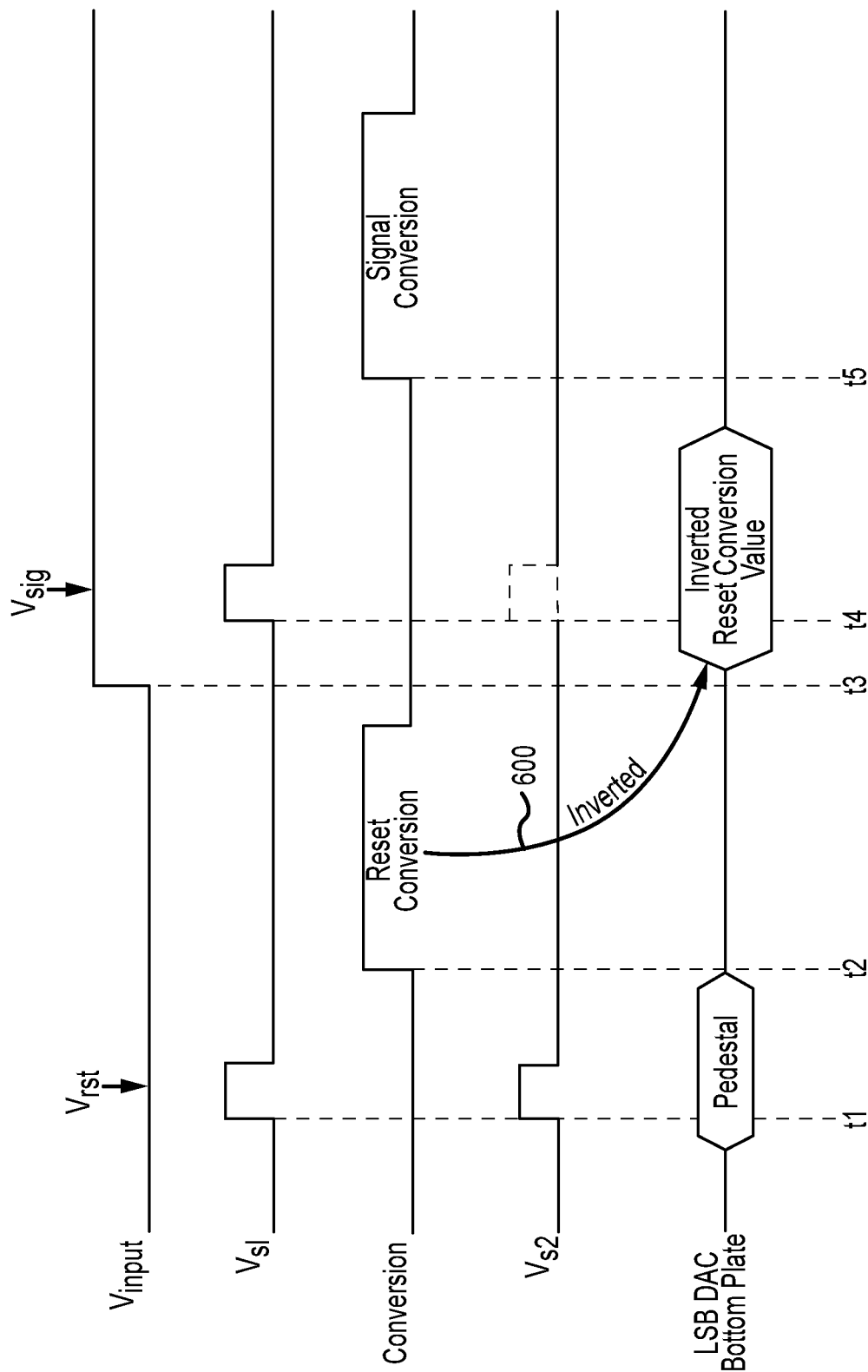
FIG. 6 is a timing diagram illustrating another way of operating the ADC shown in FIG. 3A that guarantees no coarse bit transitions for signal levels up to the full scale value for the fine bits in accordance with an embodiment.

FIG. 6 is a timing diagram showing an illustrative method of operating ADC 214 of the type shown in FIG. 3A that guarantees no coarse bit transitions for signal levels up to approximately the full scale value for the fine bits. Prior to time t1, a pedestal value should be set. There is normally some amount of flexibility in the level of the pedestal value, but the fine bits of the pedestal should correspond to the maximum fine value minus a small value noise_offset. For example, if the fine section is 6 bits and noise_offset is equal to 5, then the fine pedestal value should be set to 63 minus 5, which equals 58. Thus, the total pedestal value can be equal to (m*64+58), where parameter m is tuned for optimal performance. This optimized pedestal value may be loaded into the SAR DAC by selectively asserting a predetermined pattern of control bits b0-b12.

At time t1 during an auto zero phase, control signals Vs1 and Vs2 may be pulsed high while the input voltage Vinput is at a reset level Vrst and while the bottom plate of the LSB DAC is set at the optimized pedestal level. Configured in this way, the top plate of the coarse section is sampled with the reset signal Vrst while the top plate of the fine section is sampled with predetermined reference voltage Vref_top.

At time t2, a reset conversion operation may be performed to read out a reset voltage level from a selected image pixel (e.g., ADC 214 may output a digital code indicative of the reset voltage level Vrst received at time t1). The resultant digital value should be close to the pedestal level, but there might be some deviation in the fine value due to noise, charge injection, offset, etc. The resulting fine value (denoted as fine reset code "fr" herein) can range anywhere from zero to its full scale value, which is 63 in a 6-bit LSB DAC example.

At time t3, the selected image pixel may output an image signal, which changes the ADC input voltage Vinput to a Vsig level. At time t4, control signal Vs1 is pulsed high to pass Vsig through to the MSB top plate and while setting the fine section using an inverted version of fr obtained during reset conversion (see arrow 600). In other words, the inverted reset conversion value is based on, dependent on, or is a function of fr. This performs an analog-domain subtraction on the fine bits. The bits of the coarse section should remain the same as that from the pedestal value at time t1. In the example of FIG. 4, reference voltage Vref_top is sampled onto the top plate of the fine section (e.g., by also pulsing high control signal Vs2) in order to keep the voltage of the Vs2 switch identical to the reset sampling phase to minimize the DNL due to the voltage dependence on the junction capacitance of that switch. This is merely optional. If the voltage dependence of the junction capacitance of the switch is small enough, the Vs2 switch need not be activated at time t4.

At time t5, a signal conversion operation may be performed to read out an image signal level from the selected image pixel (i.e., ADC 214 may output a digital code indicative of the signal voltage level Vsig received at time t4).

Figure 7:
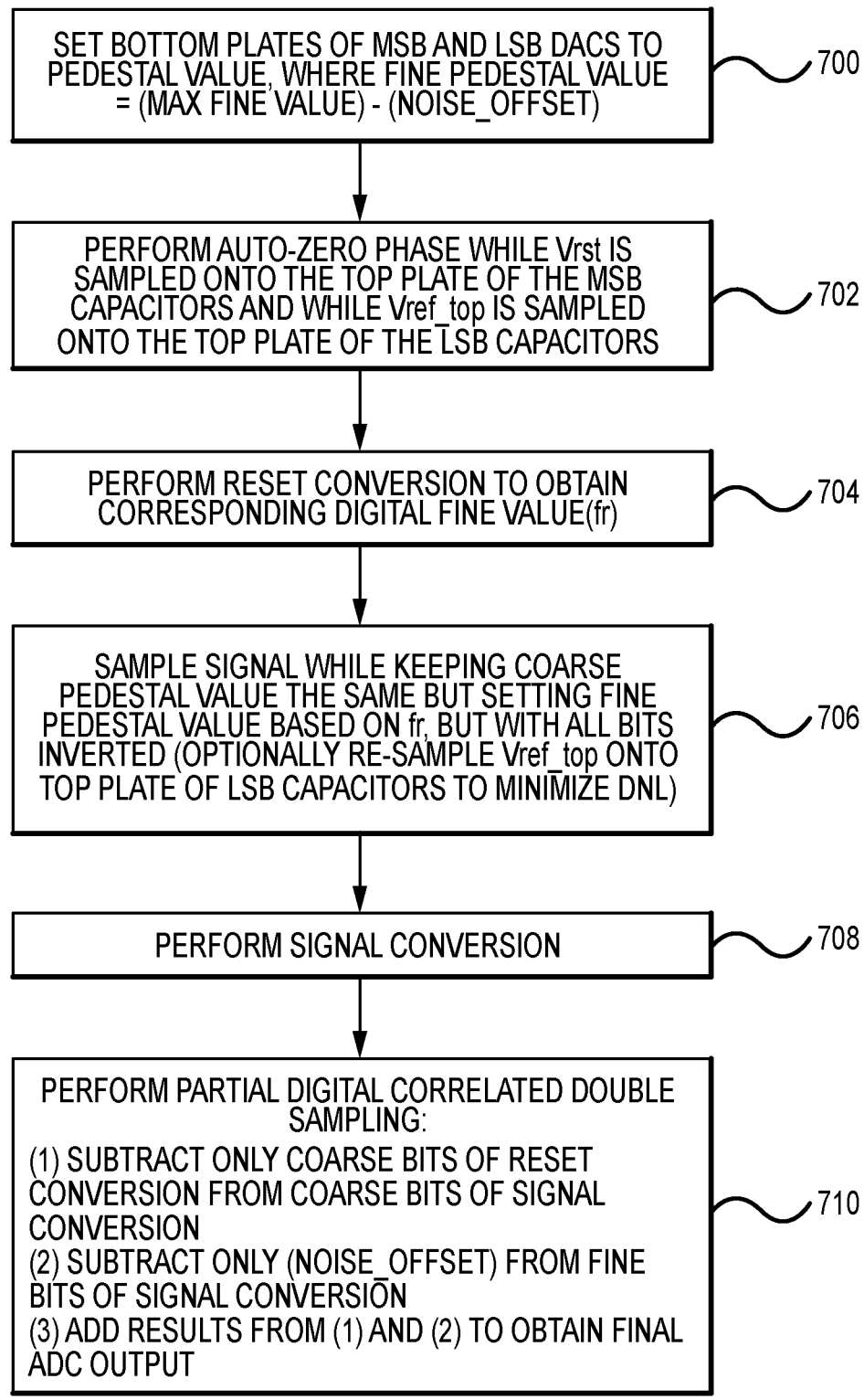
FIG. 7 is a flow chart of illustrative steps for operating an ADC of the type shown in FIG. 3A or 3B to minimize DNL in accordance with an embodiment.

FIG. 7 is a flow chart of illustrative steps for operating an ADC of the type shown in FIG. 3A to minimize DNL. At step 700, the bottom plates of the coarse and fine sections are set using the predetermined pedestal value, where the fine pedestal value is set equal to the maximum fine value minus noise_offset. At step 702, a comparator auto-zero phase is performed while Vrst is sampled onto the top plate of the MSB DAC capacitors and while reference voltage Vref_top is sampled onto the top plate of the LSB DAC capacitors.

At step 704, the ADC may perform reset conversion to obtain a corresponding digital fine value fr. At step 706, the image signal Vsig may be sampled while keeping the coarse pedestal value the same but setting the fine pedestal value based on fr but will all bits inverted. The top plate of the LSB capacitors may optionally be resampled with reference voltage Vref_top to minimize DNL. At step 708, the ADC may perform signal conversion to obtain a signal code.

Typically, the coarse and fine bits of a conversion are simply concatenated and treated as the output of an ADC. In conventional digital correlated double sampling (DCDS), the concatenated value from the reset conversion is simply subtracted from the concatenated value from the signal conversion.

At step 710, however, due to the change in the LSB DAC bits during the signal sampling phase, the fine bits of the reset conversion should not be subtracted from the fine bits of the signal conversion. The pedestal adjustment to the inverted version of fr effectively mimics this subtraction, albeit implemented in the analog domain. Thus, the post processing needs to only perform partial DCDS by (1) subtracting only the coarse bits of the reset conversion from the coarse bits of the signal conversion, (2) subtracting only noise_offset from the fine bits of the signal conversion (i.e., from the fine bits of the signal code), and (3) adding the results from (1) and (2) to obtain the final ADC output. In other words, digital correlated double sampling is only performed for the coarse DAC section but not for the fine DAC section. If noise_offset is zero, the fine bits can be concatenated to the subtracted coarse bits. If noise_offset is not zero, this subtraction from the fine signal conversion bits can be performed later since it is constant across the pixel columns, which can help simplify the column logic circuitry.

Figure 8:
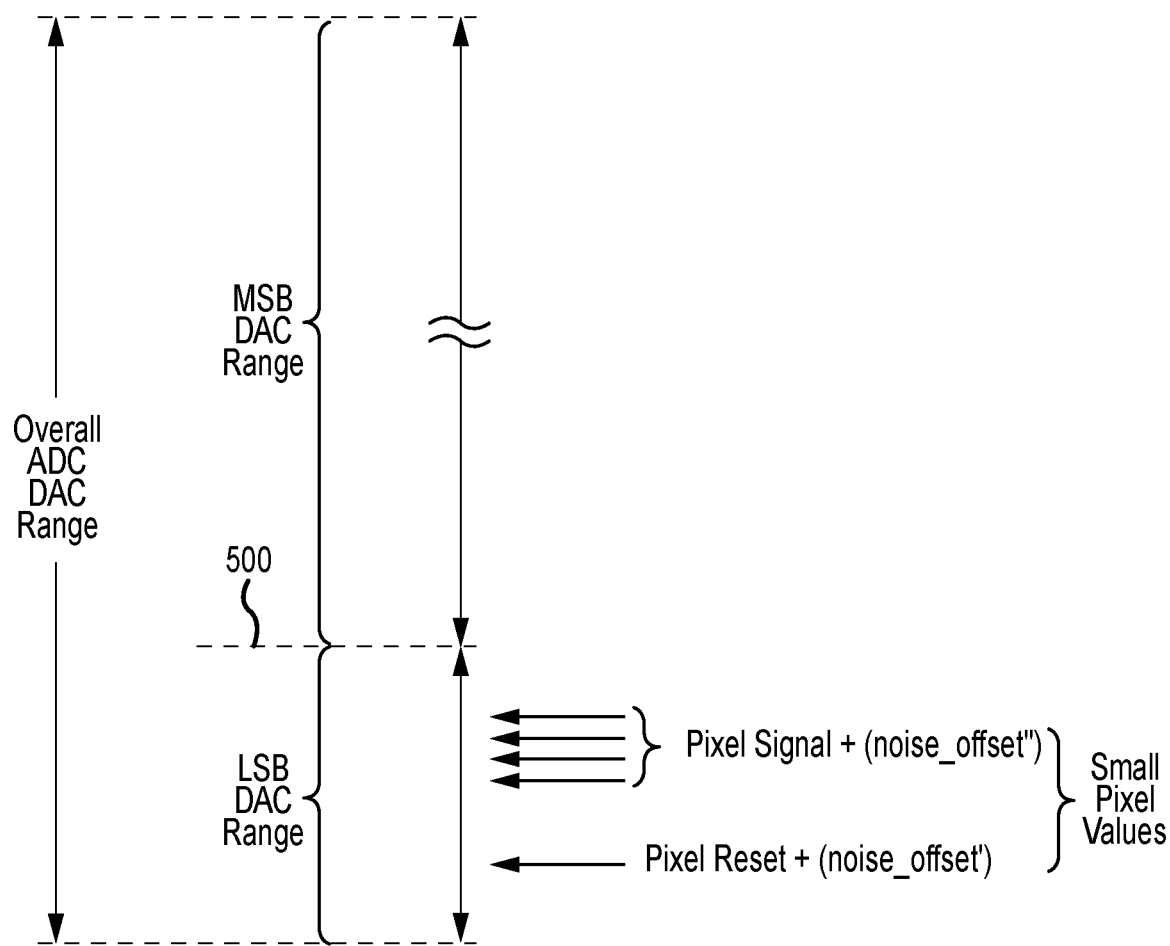
FIG. 8 is a diagram illustrating how pixel signals will stay within the fine DAC range to remove the undesired effects of DNL in accordance with an embodiment.

Operating an ADC using this scheme can help guarantee that the coarse bits of the MSB DAC array do not change between the reset and signal conversions for (signal−reset) values between −noise_offset and (LSB full scale value−noise_offset). This improvement is illustrated in FIG. 8 where the pixel signal with the added noise_offset" is prevented from crossing the MSB and LSB DAC split 500. Effectively, the ADC transfer curve is shifted downwards by a value equal to (fr minus noise_offset) from the reset to signal conversion phases, so that is the signal level happens to be the same as the reset level, the fine output after the signal conversion will be equal to noise_offset. In FIG. 8, noise_offset' may represent the sum of the MSB bits of the pedestal with noise_offset, whereas noise_offset" may represent the MSB bits of noise_offset' since the LSB portion is already subtracted out. By preventing no coarse bit transitions between the reset and signal conversions, the DNL associated with the coarse bits is avoided, which leads to better image quality in low light conditions. The value of noise_offset should be a small fraction of the LSB range in order to cover any noise and the worst case DNL of the ADC. For example, if the RMS (root-mean-square) noise is 2 LSBs and the worst case DNL is 4 LSBs, the noise_offset can be three times the RMS noise (in other words, 3 sigma) plus the worst case DNL or 10 LSBs. Making the noise_offset too high in relation to the total LSB range will reduce the positive range of the final output for which coarse bits do not change.

In some embodiments, reference voltage Vref_top should be chosen to allow swings on the top plate of the fine section without turning on any diffusion junctions or parasitic metal-oxide-semiconductor devices. In case Vs2 is pulsed high during T4, reference voltage Vref_top should be at least a full scale voltage (Vhi minus Vlo) away from either power supply voltage, ignoring noise_offset. Thus, if the positive power supply voltage is 3V and (Vhi−Vlo) is 1V, then Vref_top can be anywhere between 1V and 2V (i.e., 3−1=2).

Figure 3B:
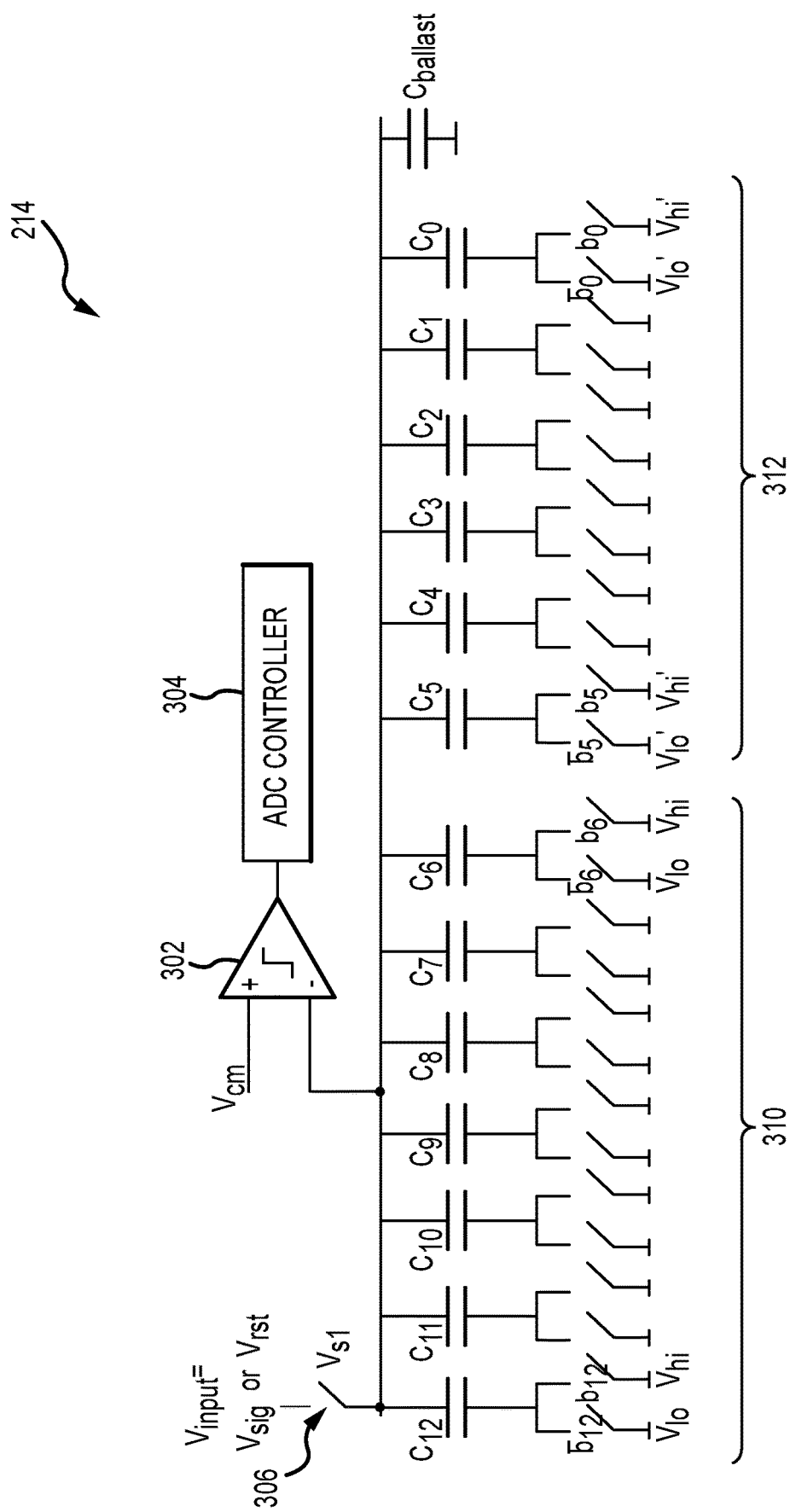

Device configurations in which the techniques of FIGS. 6-8 are applied to ADC 214 of FIG. 3A is merely illustrative and is not intended to limit the scope of the present embodiments. If desired, the improved scheme for minimizing DNL may be applied to other ADC architectures (e.g., other SAR ADC or split-SAR ADC arrangements) such as the one illustrated in FIG. 3B. As shown in FIG. 3B, ADC 214' uses split references instead of a coupling capacitor Cc (e.g., the top plate terminals of the fine section is directly connected to the top plate terminals of the coarse section). The coarse section will still use reference voltages Vlo and Vhi, but the fine section will now use attenuated references voltage Vlo' and Vhi'. Range (Vhi'−Vlo') will only be a fraction of (Vhi-Vlo), which can be ½, ¼, ⅛, 1/16, etc. Using a smaller reference voltage range for the LSB DAC portion mimics the attenuation achieved using coupling capacitor Cc. Removing coupling capacitor Cc also obviates the need for the Vs2 sampling switch.

The foregoing is merely illustrative of the principles of this invention and various modifications can be made by those skilled in the art. The foregoing embodiments may be implemented individually or in any combination.

What is claimed is:

1. An image sensor, comprising:
a plurality of image sensor pixels;
an output line coupled to the plurality of image sensor pixels; and
a data converter configured to receive signals from the output line, wherein the data converter comprises:
a coarse digital-to-analog converter (DAC) section having a first array of capacitors; and
a fine digital-to-analog converter (DAC) section having a second array of capacitors, wherein the fine DAC section is configured to receive a pedestal value during a reset sampling phase and to receive a dynamically adjustable value that is different than the pedestal value during a signal sampling phase to reduce differential non-linearity at the data converter.

2. The image sensor of claim 1, wherein the data converter is further configured to perform a reset conversion operation to obtain a reset code.

3. The image sensor of claim 2, wherein the dynamically adjustable value is a function of the reset code.

4. The image sensor of claim 3, wherein the dynamically adjustable value is an inverted version of the reset code.

5. The image sensor of claim 1, wherein the coarse DAC section is configured to receive the same pedestal value during the reset sampling phase and signal sampling phase.

6. The image sensor of claim 1, wherein the data converter is configured to output first coarse bits during a reset conversion operation and to output second coarse bits during a signal conversion operation, and wherein the image sensor is configured to compute a difference of the first and second coarse bits.

7. The image sensor of claim 1, wherein the pedestal value has fine bits that is equal to the difference between the maximum value of the fine DAC section minus a noise offset value.

8. The image sensor of claim 7, wherein the data converter is further configured to perform a signal conversion operation to obtain a signal code, and wherein the image sensor is configured to only subtract the noise offset value from fine bits of the signal code.

9. The image sensor of claim 1, wherein the data converter comprises a successive approximation register (SAR) digital-to-analog converter.

10. The image sensor of claim 9, wherein the fine DAC section is coupled to the coarse DAC section via a coupling capacitor, and wherein a reference voltage is selectively applied to top plate terminals of the fine DAC section.

11. The image sensor of claim 9, wherein the fine DAC section is directly connected to the coarse DAC section, wherein voltages of a first range is selectively applied to bottom plate terminals of the coarse DAC section, and wherein voltages to a second range that is only a fraction of the first range is selectively applied to bottom plate terminals of the fine DAC section.

12. A method of operating an image sensor that includes a data converter having a split architecture with a most significant bit (MSB) section and a least significant bit (LSB) section, the method comprising:
sampling a reset signal;
providing a fine pedestal value to the LSB section while the reset signal is being sampled;

performing a reset conversion to obtain a fine reset code for the LSB section;

sampling an image signal; and providing an adjustable value that is different than the fine pedestal value to the LSB section while the image signal is being sampled in order to minimize differential non-linearity for the data converter.

13. The method of claim 12, wherein providing the adjustable value comprises providing a value that is an inverted version of the fine reset code.

14. The method of claim 12, further comprising:

providing a coarse pedestal value to the MSB section while the reset signal is being sampled; and providing the coarse pedestal value to the MSB section while the image signal is being sampled.

15. The method of claim 12, further comprising:

performing the reset conversion to obtain a coarse reset code for the MSB section;

performing a signal conversion to obtain a coarse signal code for the MSB section and a fine signal code for the LSB section;

subtracting the coarse reset code from the coarse signal code; and subtracting only a noise offset value from the fine signal code without subtracting the fine reset code from the fine signal code.

16. An analog-to-digital converter circuit, comprising:

a comparator having an input;

a coarse digital-to-analog converter (DAC) portion coupled to the input of the comparator; and a fine digital-to-analog converter (DAC) portion coupled to the input of the comparator, wherein different offset values are applied to the fine DAC portion during a reset sampling phase and during a signal sampling phase so that there are no coarse bit transitions between a reset conversion operation that follows the reset sampling phase and a signal conversion operation that follows the signal sampling phase.

17. The analog-to-digital converter circuit of claim 16, wherein a pedestal offset value is applied to the fine DAC portion during the reset sampling phase, and wherein a dynamically adjustable offset value that is different than the pedestal offset value is applied to the fine DAC portion during the signal sampling phase.

18. The analog-to-digital converter circuit of claim 17, wherein the reset conversion operation outputs a fine reset value for the fine DAC portion, and wherein the dynamically adjustable offset value is set based on the fine reset value obtained from the reset conversion operation.

19. The analog-to-digital converter circuit of claim 18, wherein digital correlated double sampling is only performed for the coarse DAC portion but not for the fine DAC portion.

20. The analog-to-digital converter circuit of claim 18, wherein the signal conversion operation outputs a fine signal value for the fine DAC portion, and wherein digital subtraction of fine reset value from the fine signal value is not needed since the subtraction of the fine reset value is already performed in the analog domain via application of the different offset values to the fine DAC portion.

* * * * *